United States Patent
Higuchi et al.

(10) Patent No.: US 8,945,293 B2
(45) Date of Patent: Feb. 3, 2015

(54) SILICON OXIDE REMOVAL APPARATUS AND FACILITY FOR RECYCLING INERT GAS FOR USE IN SILICON SINGLE CRYSTAL MANUFACTURING APPARATUS

(75) Inventors: Takashi Higuchi, Nishishirakawa (JP); Tadahiko Horiuchi, Nishishirakawa (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 328 days.

(21) Appl. No.: 13/383,298

(22) PCT Filed: May 27, 2010

(86) PCT No.: PCT/JP2010/003548
§ 371 (c)(1),
(2), (4) Date: Jan. 10, 2012

(87) PCT Pub. No.: WO2011/016167
PCT Pub. Date: Feb. 10, 2011

(65) Prior Publication Data
US 2012/0114531 A1    May 10, 2012

(30) Foreign Application Priority Data

Aug. 6, 2009 (JP) ................................. 2009-183091
Oct. 9, 2009 (JP) ................................. 2009-235008

(51) Int. Cl.
*B01D 47/00* (2006.01)
*C30B 15/20* (2006.01)
(Continued)

(52) U.S. Cl.
CPC ................ *C30B 15/20* (2013.01); *C30B 15/00* (2013.01); *C30B 29/06* (2013.01); *C30B 35/00* (2013.01); *F27B 14/08* (2013.01); *F27D 17/008* (2013.01)
USPC .................................. 96/243; 96/267; 96/274

(58) Field of Classification Search
None
See application file for complete search history.

(56) References Cited

U.S. PATENT DOCUMENTS 4,765,805 A * 8/1988 Wahl et al. ........................ 95/8
6,838,066 B2 * 1/2005 Rao ............................... 423/262
(Continued)

FOREIGN PATENT DOCUMENTS

JP    A-62-186924    8/1987
JP    B2-06-024962    4/1994
(Continued)

OTHER PUBLICATIONS

English Translation of JP2004002180.*
(Continued)

*Primary Examiner* — Duane Smith
*Assistant Examiner* — Phillip Shao
(74) *Attorney, Agent, or Firm* — Oliff PLC

(57) ABSTRACT

A silicon oxide removal apparatus for removing silicon oxide contained in an inert gas discharged from a silicon single crystal manufacturing apparatus, including at least: a contact means for bringing the inert gas discharged from the silicon single crystal manufacturing apparatus into contact with a strongly alkaline solution; and a neutralizing means for neutralizing an alkaline material contained in the inert gas brought into contact with the strongly alkaline solution. As a result, there is provided a silicon oxide removal apparatus and a facility for recycling an inert gas for use in a silicon single crystal manufacturing apparatus that can more effectively remove the silicon oxide contained in the inert gas discharged from the silicon single crystal manufacturing apparatus at low cost and enable recycle of the inert gas in which the silicon oxide has been effectively removed.

12 Claims, 3 Drawing Sheets

(51) Int. Cl.
*C30B 15/00* (2006.01)
*C30B 29/06* (2006.01)
*C30B 35/00* (2006.01)
*F27B 14/08* (2006.01)
*F27D 17/00* (2006.01)

(56) References Cited

U.S. PATENT DOCUMENTS

2003/0200867 A1  10/2003  Becker et al.
2008/0050299 A1*  2/2008  Bedell et al. ............ 423/243.06

FOREIGN PATENT DOCUMENTS

| JP | B2-2853757 | | 2/1999 |
| JP | 2004002180 A | * | 1/2004 |
| JP | A-2004-002180 | | 1/2004 |
| WO | WO 2008/027156 A1 | | 3/2008 |

OTHER PUBLICATIONS

International Search Report issued in Application No. PCT/JP2010/003548; Dated Jun. 29, 2010 (With Translation).
International Preliminary Report on Patentability issued in Application No. PCT/JP2010/003548; Dated Mar. 13, 2012.
Japanese Office Action issued in Application No. 2009-235008; Dated Apr. 16, 2013 (With Partial English-language Translation).
Jan. 6, 2014 Chinese Office Action issued in Chinese Patent Application No. 201080035023.6 (with partial English-language translation).
May 26, 2014 The $2^{nd}$ Office Action issued in Chinese Application No. 201080035023.6 with partial English-language translation.
Sep. 9, 2014 Notification of Reasons for Refusal issued in Chinese Patent Application No. 201080035023.6 (with translation).

* cited by examiner

SILICON OXIDE REMOVAL APPARATUS AND FACILITY FOR RECYCLING INERT GAS FOR USE IN SILICON SINGLE CRYSTAL MANUFACTURING APPARATUS

TECHNICAL FIELD

The present invention relates to removal of silicon oxide contained in an inert gas discharged from a silicon single crystal manufacturing apparatus based on the Czochralski method (the CZ method) that manufactures a silicon single crystal for use in, for example, semiconductor devices and solar batteries, and to a facility for recycling an inert gas.

BACKGROUND ART

Conventionally, a method of obtaining a silicon single crystal for use in, for example, semiconductor devices and solar batteries as a single crystal ingot by using the CZ method has been widely used. FIG. 5 shows a schematic view of a silicon single crystal manufacturing apparatus that is generally used. As shown in FIG. 5, in the silicon single crystal manufacturing apparatus 20, vertically movable crucibles 22 and 23 that accommodate a silicon melt 21, and a heater 24 that is arranged so as to surround the crucibles 22 and 23 are generally arranged in a main chamber 26 where a single crystal 25 is grown. A pulling chamber 27 for accommodating and taking out the grown single crystal 25 is continuously provided above the main chamber 26.

For the purpose of discharging oxides generated in a furnace out of the furnace etc., an inert gas such as argon gas is introduced into the chambers from a gas inlet 28 provided at an upper portion of the pulling chamber 27. The inert gas is guided so as to flow near the single crystal 25 by using a graphite gas flow-guide cylinder 30, and discharged from a gas outlet 29. A seed crystal 31 is brought into contact with the silicon melt 21 and the single crystal 25 is then grown.

There has been known two pulling methods. One of the methods is an atmospheric pressure method in which the single crystal is pulled in an atmosphere inside the furnace that is maintained at approximately an atmospheric pressure. The other method is a reduced pressure method in which the single crystal is pulled in a reduced pressure atmosphere inside the furnace that is brought to a low vacuum area (10 to 500 hPa). The reduced pressure method is now more common.

In the above manufacture of the silicon single crystal, the inert gas discharged from the silicon single crystal manufacturing apparatus 20 includes silicon oxide generated in the apparatus and an impurity gas, such as CO, $CO_2$, $O_2$, $N_2$, $H_2$, and the like.

In recent years, the required amount of the inert gas has increased as silicon single crystal manufacture has increased in scale. Collecting and recycling the inert gas discharged from the silicon single crystal manufacturing apparatus have been accordingly important for reduction of cost. To realize this, it is necessary to remove the above-described silicon oxide and impurity gas contained in the discharged inert gas and purify it.

Conventionally, a facility in which an oil-sealed rotary vacuum pump, a gas purification unit, and the like are connected to the silicon single crystal manufacturing apparatus are common for recycling the inert gas. In the facility, however, there is a problem in that an oil mist, which is difficult to be separately collected, is mixed to the inert gas that is heated at a high temperature and that is then discharged from the silicon single crystal manufacturing apparatus, since the vacuum pump uses an oil. This oil mist causes environmental pollution when it is emitted to air. A water ring vacuum pump has been also used to avoid this problem. However, the water ring vacuum pump needs a large amount of water and consumes a large amount of electric power, and its cost thus becomes high.

Accordingly, a dry type pump, so-called a dry pump, has been becoming more common since it can reduce cost more than the two wet type pump described above. For example, there is described an inert gas recycling apparatus provided with, behind the dry pump, a wet type bubbler, an electric fine particle collector, and a purification unit etc. (See Patent document 1).

A method for removing fine particles, such as fine powders of silicon oxide, contained in a gas discharged from a single crystal manufacturing furnace by introducing the gas into a venturi scrubber has been known (See Patent document 2).

When the above-described conventional apparatus and method are used to remove the silicon oxide contained in the inert gas, however, the silicon oxide cannot be removed sufficiently since the silicon oxide is a fine powder of the order of several microns in size, its maintainability becomes low, and its operation cost becomes high.

CITATION LIST

Patent Literature

Patent document 1: Japanese Patent No. 2853757
Patent document 2: Japanese Examined Patent Publication (Kokai) No. 6-24962

SUMMARY OF INVENTION

The present invention was accomplished in view of the above-described problems, and its object is to provide a silicon oxide removal apparatus and a facility for recycling an inert gas for use in a silicon single crystal manufacturing apparatus using the silicon oxide removal apparatus that can more effectively remove the silicon oxide contained in the inert gas discharged from the silicon single crystal manufacturing apparatus at low cost and enable recycle of the inert gas in which the silicon oxide has been effectively removed.

To achieve this object, the present invention provides a silicon oxide removal apparatus for removing silicon oxide contained in an inert gas discharged from a silicon single crystal manufacturing apparatus, the silicon oxide removal apparatus comprising at least: a contact means for bringing the inert gas discharged from the silicon single crystal manufacturing apparatus into contact with a strongly alkaline solution; and a neutralizing means for neutralizing an alkaline material contained in the inert gas brought into contact with the strongly alkaline solution.

The above silicon oxide removal apparatus including at least: the contact means for bringing the inert gas discharged from the silicon single crystal manufacturing apparatus into contact with a strongly alkaline solution; and the neutralizing means for neutralizing an alkaline material contained in the inert gas brought into contact with the strongly alkaline solution can effectively separate the silicon oxide contained in the inert gas discharged from the silicon single crystal manufacturing apparatus, thereby more effectively remove the silicon oxide at low cost, and enables the recycle of the inert gas in which the silicon oxide has been effectively removed. In addition, the silicon oxide removal apparatus that neutralizes the alkaline material by causing the fine powder of silicon oxide to react with the strongly alkaline solution can suppress its operation cost to low cost with high maintainability.

In the above silicon oxide removal apparatus, the contact means is preferably any one of a scrubber, ejector, mixer, and nash pump, or a combination thereof.

When the contact means is any one of the scrubber, ejector, mixer, and nash pump, or the combination thereof, the silicon oxide removal apparatus can promote dissolution of the silicon oxide by effectively bringing the silicon oxide into contact with the strongly alkaline solution, and thereby more effectively remove the silicon oxide.

In the above silicon oxide removal apparatus, the neutralizing means may be a water scrubber or an acid scrubber.

When the neutralizing means is the water scrubber or the acid scrubber, the silicon oxide removal apparatus can neutralize, with a simple structure, the alkaline material contained in the inert gas brought into contact with the strongly alkaline solution.

The above silicon oxide removal apparatus preferably includes a mechanism for heating the strongly alkaline solution to be brought into contact with the inert gas discharged from the silicon single crystal manufacturing apparatus.

When the silicon oxide removal apparatus includes the mechanism for heating the strongly alkaline solution to be brought into contact with the inert gas discharged from the silicon single crystal manufacturing apparatus, the silicon oxide removal apparatus can more effectively remove the silicon oxide by heating the strongly alkaline solution to be brought into contact with the inert gas.

In the above silicon oxide removal apparatus, the strongly alkaline solution is preferably a sodium hydroxide solution.

When the strongly alkaline solution is a sodium hydroxide solution, the silicon oxide removal apparatus can remove the silicon oxide at lower cost by using a low-cost sodium hydroxide solution.

Furthermore, the present invention provides a facility for recycling an inert gas for use in a silicon single crystal manufacturing apparatus by collecting and purifying the inert gas discharged from the silicon single crystal manufacturing apparatus and supplying the purified inert gas to the silicon single crystal manufacturing apparatus, the facility comprising at least the silicon oxide removal apparatus according to the present invention to remove silicon oxide contained in the discharged inert gas before the inert gas is purified.

The above facility for recycling an inert gas, including the silicon oxide removal apparatus according to the present invention to remove the silicon oxide contained in the discharged inert gas before the inert gas is purified can effectively separate and remove the silicon oxide contained in the inert gas discharged from the silicon single crystal manufacturing apparatus at low cost and can recycle the inert gas by supplying the purified inert gas with high purity to the silicon single crystal manufacturing apparatus again. In addition, the facility for recycling an inert gas, including the silicon oxide removal apparatus that neutralizes the alkaline material by causing the fine powder of silicon oxide to react with the strongly alkaline solution can also suppress its operation cost to low cost with high maintainability.

As described above, the silicon oxide removal apparatus according to the present invention for removing silicon oxide contained in an inert gas discharged from a silicon single crystal manufacturing apparatus includes at least: the contact means for bringing the inert gas discharged from the silicon single crystal manufacturing apparatus into contact with a strongly alkaline solution; and the neutralizing means for neutralizing an alkaline material contained in the inert gas brought into contact with the strongly alkaline solution.

Therefore, the silicon oxide removal apparatus can effectively separate the silicon oxide contained in the inert gas discharged from the silicon single crystal manufacturing apparatus, thereby more effectively remove the silicon oxide at low cost, and enable the recycle of the inert gas in which the silicon oxide has been effectively removed. In addition, the silicon oxide removal apparatus that neutralizes the alkaline material by causing the fine powder of silicon oxide to react with the strongly alkaline solution can also suppress its operation cost to low cost with high maintainability.

DESCRIPTION OF EMBODIMENTS

Hereinafter, an embodiment of the present invention will be described, but the present invention is not restricted thereto.

In recent years, as silicon single crystal manufacture has increased in scale, demand for an inert gas used in the manufacture, such as an argon gas, has increased. Effectively collecting and recycling the inert gas discharged from the silicon single crystal manufacturing apparatus has been accordingly important for reduction of cost. To realize this, it is necessary to effectively remove the silicon oxide contained in the discharged inert gas. For removal of the silicon oxide contained in the discharged inert gas, conventionally, a filter is used, or the inert gas is subjected to gas bubbling in water with a fine particle collector, such as a venturi scrubber.

When the above conventional apparatus and method are used to remove the silicon oxide contained in the inert gas, however, the silicon oxide cannot be removed sufficiently since the silicon oxide is a fine powder of the order of several microns in size. It has been therefore expected to remove the silicon oxide more effectively. In addition, there is also a problem in that apparatus maintainability becomes low since the removed silicon oxide is a fine powder and its operation cost thus becomes high.

In view of this, the present inventors repeatedly keenly conducted studies to solve the problems. As a result, the present inventors conceived that the silicon oxide can be more effectively removed by separating it from the inert gas by bringing the silicon oxide into contact with a strongly alkaline solution. In addition, the present inventors found that by using a mixer, particularly such as an ejector and a static mixer, a fine powder of silicon oxide, which is water repellent and hard to be mixed with the strongly alkaline solution, can be effectively brought into contact with the strongly alkaline solution, and dissolution of the silicon oxide is thereby promoted, and the removal of the silicon oxide can be consequently improved. The inventors thereby brought the present invention to completion.

Figure 1:
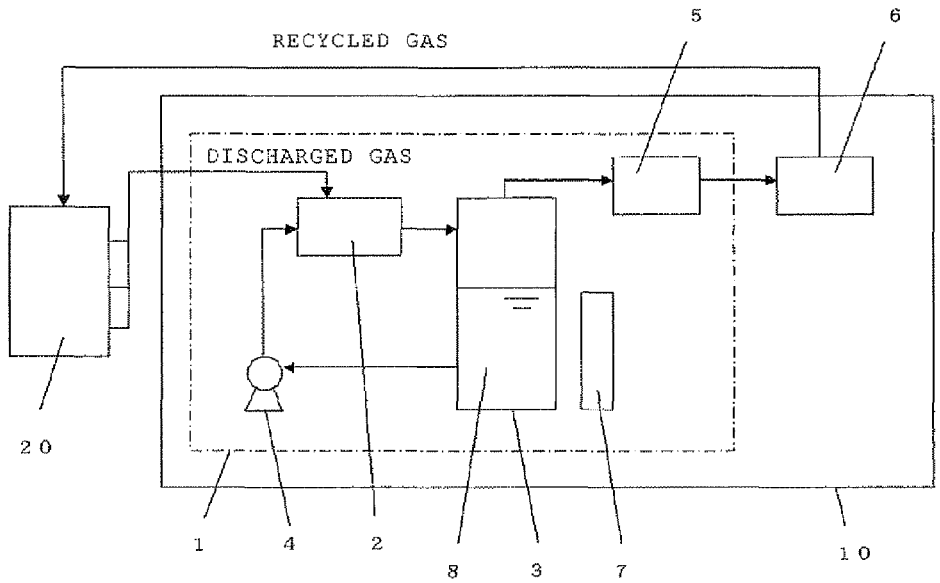
FIG. 1 is a schematic view showing an example of the silicon oxide removal apparatus and facility for recycling an inert gas for use in a silicon single crystal manufacturing apparatus, according to the present invention.

FIG. 1 is a schematic view showing an example of the silicon oxide removal apparatus and facility for recycling an inert gas for use in a silicon single crystal manufacturing apparatus of the present invention.

As shown in FIG. 1, the facility 10 collects and purifies the inert gas discharged from the silicon single crystal manufacturing apparatus 20, and supplies the purified inert gas to the silicon single crystal manufacturing apparatus 20 again to recycle the inert gas. The silicon oxide removal apparatus 1 of the present invention removes the silicon oxide contained in the inert gas discharged from the silicon single crystal manufacturing apparatus 20.

The silicon single crystal manufacturing apparatus 20 that discharges the inert gas to be treated in the present invention will be now described in brief.

Figure 5:
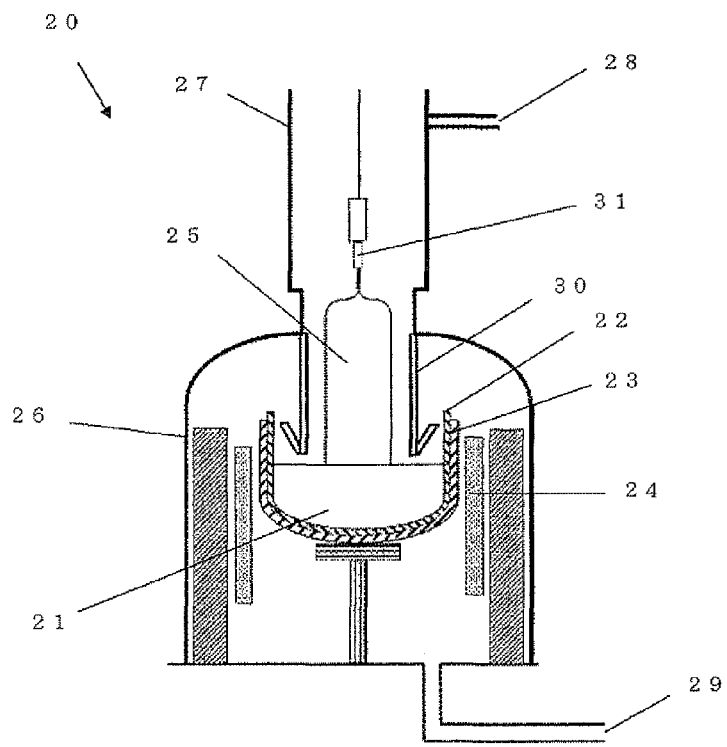
FIG. 5 is a schematic view showing an example of a general silicon single crystal manufacturing apparatus.

The silicon single crystal manufacturing apparatus 20 may be configured as, for example, a general silicon single crystal manufacturing apparatus shown in FIG. 5.

As shown in FIG. 5, in the silicon single crystal manufacturing apparatus 20, crucibles 22 and 23 that accommodate a silicon melt 21 and can be moved upwardly and downwardly, and a graphite heater 24 that is arranged so as to surround the crucibles 22 and 23 are arranged in a main chamber 26 where a single crystal 25 is grown. A pulling chamber 27 for accommodating and taking out the grown single crystal 25 is continuously provided above the main chamber 26.

The crucibles 22 and 23 are composed of an inside quartz crucible 22 for directly accommodating the silicon melt 21 and an outside graphite crucible 23 for supporting the quartz crucible 22.

For the purpose of discharging silicon oxide generated in a furnace out of the furnace etc., the inert gas such as an argon gas is introduced into the chambers from a gas inlet 28 provided at an upper portion of the pulling chamber 27. The inert gas is guided so as to flow near the single crystal 25 by using a graphite gas flow-guide cylinder 30, and discharged from a gas outlet 29. A seed crystal 31 is brought into contact with the silicon melt 21 and the single crystal 25 is then grown.

In the growth of the single crystal, fine powders of silicon oxide are generated by the reaction between the quartz crucible 22 accommodating the silicon melt 21 and the silicon melt 21. In the single crystal growth, CO gas and $CO_2$ gas are also generated by the reaction between the silicon oxide and the graphite heater etc., for example, while gases such as $N_2$ gas and $H_2$ gas are generated from the other graphite parts. The inert gas discharged from the silicon single crystal manufacturing apparatus thus includes the fine powders of silicon oxide and various impurity gases. The concentration of the silicon oxide contained in the inert gas is approximately 20 mg/m$^3$.

The silicon oxide removal apparatus of the present invention for removing the silicon oxide in the inert gas discharged from the silicon single crystal manufacturing apparatus will be described below.

In the silicon oxide removal apparatus of the present invention, exemplary strongly alkaline solutions may include a sodium hydroxide solution, potassium hydroxide solution, lithium hydroxide solution, rubidium hydroxide solution, and cesium hydroxide solution. Here, an example in which the sodium hydroxide solution is used will be described.

As shown in FIG. 1, the silicon oxide removal apparatus 1 of the present invention includes a tank 3 for storing the strongly alkaline solution (the sodium hydroxide solution) 8, the contact means 2 for bringing the inert gas discharged from the silicon single crystal manufacturing apparatus 20 into contact with the sodium hydroxide solution 8, and a circulating pump 4 for supplying the sodium hydroxide solution 8 to the contact means 2.

The sodium hydroxide solution 8 stored in the tank 3 is supplied to the contact means 2 by the circulating pump 4. The contact means 2 brings the inert gas into contact with the sodium hydroxide solution 8. Here, the flow rate at which the sodium hydroxide solution 8 is supplied to the contact means 2 by the circulating pump 4 may be approximately 20 L/min, for example, but the present invention is not restricted thereto.

The silicon oxide contained in the inert gas brought into contact with the sodium hydroxide solution 8 is dissolved into the sodium hydroxide solution 8 by the following chemical reaction.

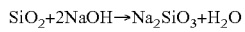

$$SiO_2 + 2NaOH \rightarrow Na_2SiO_3 + H_2O$$

Here, the concentration of the sodium hydroxide solution may be 10 to 50%, for example, but the present invention is not restricted thereto.

As shown in FIG. 1, the silicon oxide removal apparatus preferably includes the mechanism 7 for heating the sodium hydroxide solution 8 to be supplied to the contact means 2. The dissolution of the silicon oxide can be promoted by heating the sodium hydroxide solution 8 with the mechanism 7, and the silicon oxide can be thereby more effectively removed. In particular, when the temperature of the sodium hydroxide solution 8 is heated to more than 50° C., the removal of the silicon oxide can be more improved.

In this case, with a scrubber as the contact means 2, the discharged inert gas can be brought into contact with the sodium hydroxide solution by causing the inert gas to pass through the sodium hydroxide solution in the scrubber.

Figure 2:
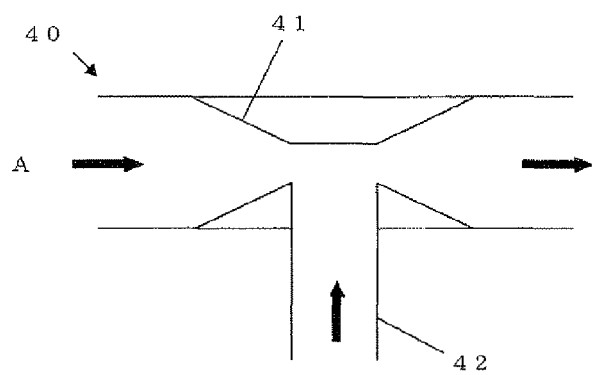
FIG. 2 is a schematic view showing an example of an ejector that can be used in the silicon oxide removal apparatus according to the present invention.

Alternatively, an ejector can be used as the contact means 2. A schematic view of the ejector is shown in FIG. 2. As shown in FIG. 2, the ejector 40 has a chamber 41 and an inlet 42 provided at the inside of the longitudinal center of the chamber. The diameter of the chamber 41 becomes smaller toward the longitudinal center. The sodium hydroxide solution flows into the ejector from the entrance of the chamber 41 (See A in FIG. 2), and passes through the smaller diameter portion of the inside of the chamber. At this point, the flow velocity of the sodium hydroxide solution increases, the sodium hydroxide solution becomes mist, and the pressure at the smaller diameter portion decreases. This pressure loss causes intake of the inert gas from the inlet 42. The inert gas is then brought into contact with the mist of the sodium hydroxide. The contact between the silicon oxide and the sodium hydroxide solution and the dissolution of the silicon oxide can be promoted by producing a mist state of the sodium hydroxide solution as described above.

When the time during which the inert gas is brought into contact with a strongly alkaline solution is 5 seconds or more, the silicon oxide can be surely removed.

A mixer can be also used as the contact means 2. A static mixer is an exemplary mixer.

Figure 3:
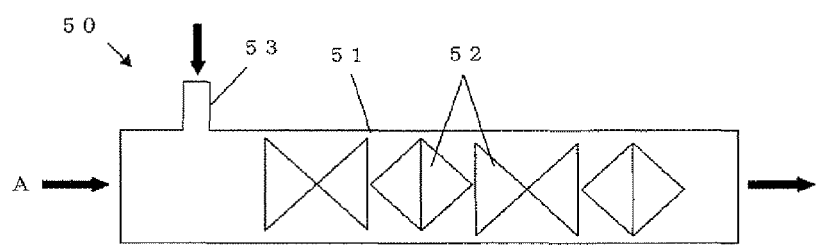
FIG. 3 is a schematic view showing an example of a static mixer that can be used in the silicon oxide removal apparatus according to the present invention.

A schematic view of the static mixer is shown in FIG. 3. As shown in FIG. 3, the static mixer 50 has a plurality of elements 52 for mixing the inert gas with the sodium hydroxide solution at the inside of a chamber 51. The sodium hydroxide solution flows into the static mixer from the entrance of the chamber 51 (See A in FIG. 3). The inert gas flows into the static mixer from a gas inlet 53. The elements 52 mixes the inert gas with the sodium hydroxide solution brought into contact with the inert gas. The contact between the silicon oxide and the sodium hydroxide solution and the dissolution of the silicon oxide can be promoted by mixing them by using the static mixer 50 as described above.

Figure 6:
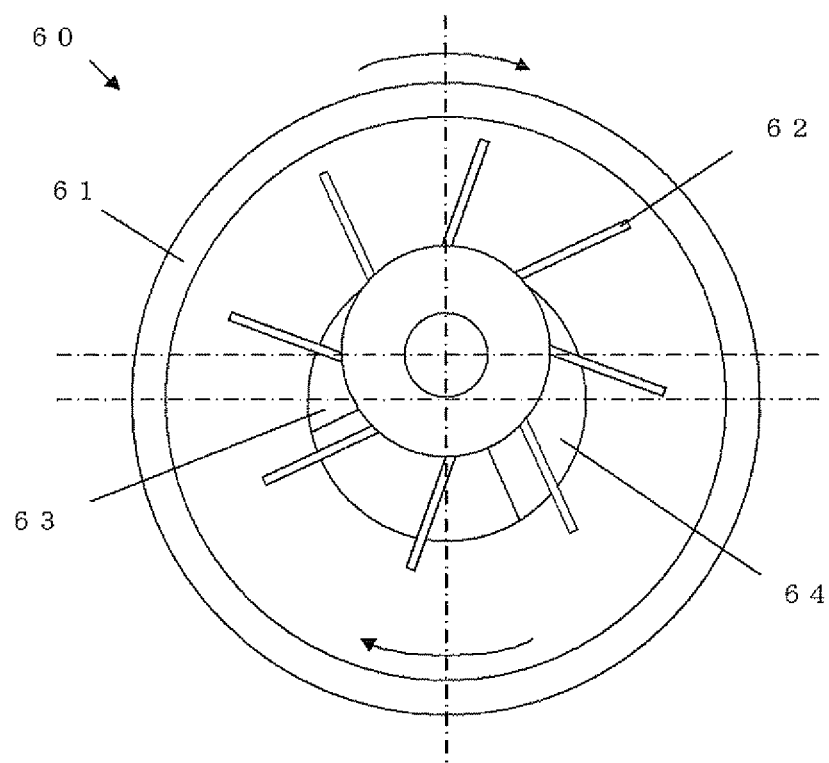
FIG. 6 is a schematic view showing an example of a nash pump that can be used in the silicon oxide removal apparatus according to the present invention.

A nush pump can be also used as the contact means 2. A schematic view of the nush pump is shown in FIG. 6. As shown in FIG. 6, the nush pump 60 has a cylindrical casing 61 for accommodating the sodium hydroxide solution, an impeller 62 having a central axis spaced from a central axis of the casing 61 and being rotatable about its central axis, an outlet 63, and an inlet 64. When the impeller 62 from which the outside is blade form is rotated, the sodium hydroxide solution flows along an inside wall of the casing 61 and forms rotary flow causing compression of the inside of the pump. The inert gas thereby flows into the nush pump from the inlet 64 and comes into contact with the sodium hydroxide solution. They are then mixed by rotating the impeller 62. The contact between the silicon oxide and the sodium hydroxide solution and the dissolution of the silicon oxide are consequently promoted. The inert gas in which the silicon oxide has been removed is discharged through the outlet 63.

As described above, when the contact means 2 for bringing the inert gas into contact with a strongly alkaline solution is any one of the scrubber, ejector, mixer, and nash pump, the silicon oxide removal apparatus can promote the dissolution of the silicon oxide by effectively bringing the silicon oxide into contact with the strongly alkaline solution, and thereby more effectively remove the silicon oxide.

Figure 4:
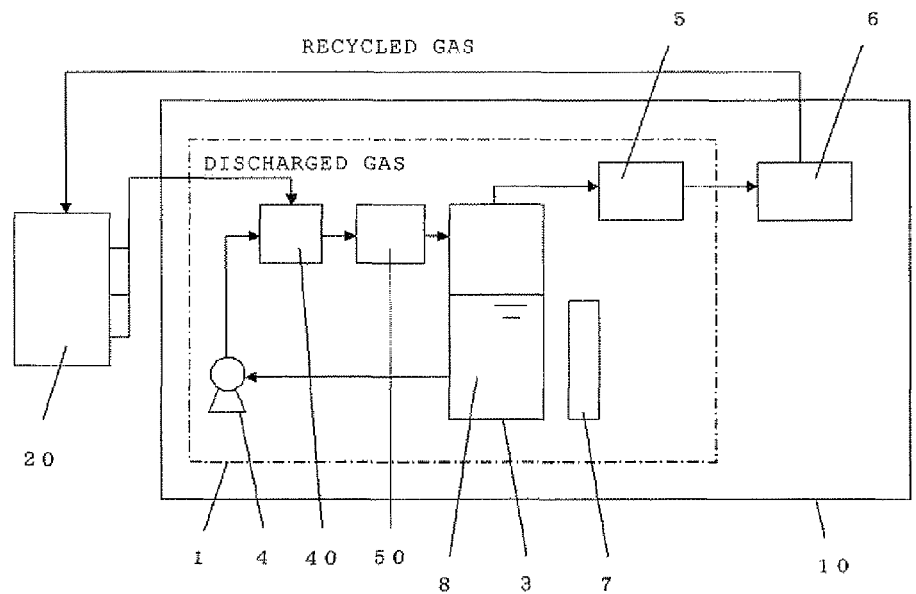
FIG. 4 is a schematic view showing another example of the silicon oxide removal apparatus and facility for recycling an inert gas for use in a silicon single crystal manufacturing apparatus, according to the present invention.

The silicon oxide removal apparatus can be also configured to include a combination of these contact means so that its capacity for mixing the strongly alkaline solution and the silicon oxide is enhanced. For example, as shown in FIG. 4, the silicon oxide removal apparatus can be configured to connect the ejector 40 and the static mixer 50 in series. This configuration enhances the capacity for mixing the strongly alkaline solution and the silicon oxide and a high collection efficiency can be thereby achieved.

As shown in FIG. 1 and FIG. 4, the silicon oxide removal apparatus 1 includes the neutralizing means 5 for neutralizing an alkaline material contained in the inert gas brought into contact with the strongly alkaline solution as described above.

The neutralizing means 5 can be configured as, for example, a water scrubber that neutralizes the alkaline material contained in the inert gas by spraying water over the inert gas brought into contact with the strongly alkaline solution, for gas liquid separation. Alternatively, the neutralizing means 5 can be configured as an acid scrubber that neutralizes, for example, the sodium hydroxide solution and $Na_2SiO_3$ (sodium silicate) generated by the above-described chemical reaction, which are alkaline, by spraying acid over the inert gas, for gas liquid separation.

As described above, since the silicon oxide removal apparatus 1 of the present invention includes at least: the contact means 2 for bringing the inert gas discharged from the silicon single crystal manufacturing apparatus 20 into contact with the strongly alkaline solution 8; and the neutralizing means 5 for neutralizing the alkaline material contained in the inert gas brought into contact with the strongly alkaline solution 8, the silicon oxide removal apparatus can effectively separate the fine powders of silicon oxide, which is extremely difficult to be separated by a conventional apparatus, contained in the inert gas discharged from the silicon single crystal manufacturing apparatus 20, and thereby more effectively remove the silicon oxide at low cost. As a result, the inert gas in which the silicon oxide has been effectively removed can be recycled.

In addition, in the silicon oxide removal apparatus 1 of the present invention, it is not necessary to handle the fine powders after the removal of the silicon oxide, since the neutralization is carried out after causing the fine powders of silicon oxide to react with the strongly alkaline solution 8. The maintainability can be therefore kept high and the operation cost can be thereby suppressed to low cost.

As described above, in the silicon oxide removal apparatus 1 of the present invention, exemplary strongly alkaline solutions include a sodium hydroxide solution, potassium hydroxide solution, lithium hydroxide solution, rubidium hydroxide solution, and cesium hydroxide solution. In particular, the sodium hydroxide solution, which is low-cost, is preferably used.

Next, the facility for recycling an inert gas for use in a silicon single crystal manufacturing apparatus of the present invention will be described below.

As shown in FIG. 1 and FIG. 4, the facility 10 of the present invention includes the above silicon oxide removal apparatus 1 of the present invention and a purification unit 6 for removing impurity gases and the like contained in the inert gas.

In the facility, the silicon oxide contained in the inert gas discharged from the silicon single crystal manufacturing apparatus 20 is removed by the silicon oxide removal apparatus 1 of the present invention, and various impurity gases and the like contained in the inert gas are then removed by the purification unit 6.

The purification unit 6 may be configured as a conventional purification unit that converts the impurity gases into $CO_2$, $N_2$, $H_2$, $O_2$, and the like at once by a catalytic reaction and removes them with an adsorbent, for example. The purification unit 6 may be also configured as a purification unit based on a liquefaction distillation method or a membrane separation method.

As described above, the facility of the present invention can effectively separate and remove the fine powders of silicon oxide, which is extremely difficult to be separated by a conventional apparatus, by using the silicon oxide removal apparatus of the present invention, and can recycle the inert gas by supplying the purified inert gas with high purity to the silicon single crystal manufacturing apparatus again.

In addition, in the facility of the present invention, it is not necessary to handle fine powders after the removal of the silicon oxide, since the neutralization is carried out after causing the fine powders of silicon oxide to react with the strongly alkaline solution. The maintainability can be therefore kept high and the operation cost can be thereby suppressed to low cost.

The silicon oxide removal apparatus of the present invention can be used as a high efficient dust collector that is alone used not only as the apparatus for use in the recycle of the used inert gas, but also as a collector of a solid body and a fine powder, since the apparatus can effectively remove the silicon oxide contained in the inert gas at low cost as described above.

The present invention will be described in more detail below with reference to Examples and Comparative Example, but the present invention is not restricted thereto.

Example 1

Silicon oxide contained in an argon gas discharged from a silicon single crystal manufacturing apparatus was removed with a silicon oxide removal apparatus of the present invention shown in FIG. 1 and FIG. 4. The used argon gas included silicon oxide having a size of 1 or more at a concentration of 3.3 mg/m$^3$. A sodium hydroxide solution having a concentration of 25%, heated to 60° C., was used as the strongly alkaline solution. The scrubber, ejector, static mixer, and nash pump were used as the contact means for bringing the inert gas into contact with the strongly alkaline solution. The contact means in which the ejector and the static mixer were connected in series was also used. The removal rate of the silicon oxide was evaluated in each of the cases of these contact means.

The result is shown in Table 1. As shown in Table 1, the removal rate was more improved in each of the cases in comparison with the result in the later-described Comparative example. In particular, the silicon oxide was completely removed in the case of the contact means in which the ejector and the static mixer were connected in series.

It was accordingly confirmed that the silicon oxide removal apparatus of the present invention can more effectively remove the silicon oxide contained in the inert gas discharged from the silicon single crystal manufacturing apparatus.

Example 2

Silicon oxide was removed as with Example 1 except two conditions. One of the conditions was the temperature of the sodium hydroxide solution, and it was set at 30° C., 50° C., 60° C., and 100° C. The other condition was the concentration of the sodium hydroxide solution, and it was changed in the range of 10 to 50%. The removal rate was evaluated in each of these cases. Here, the ejector was used as the contact means for bringing the inert gas into contact with the strongly alkaline solution.

As a result, the following were found. The removal rate differed according to the concentration of the sodium hydroxide solution. When the concentration was in the range of 20 to 50%, the removal rate was sufficiently improved, and a concentration of 20 to 30% was particularly preferable.

The removal rate of the silicon oxide was able to be improved by increasing the temperature of the sodium hydroxide solution. When the temperature was 50 to 100° C., the removal rate was sufficiently improved. In particular, when the temperature was 50 to 60° C., cost was able to be reduced by, for example, using a vinyl chloride container and pipe. This temperature was thus advantageous in the removal rate and cost.

Comparative Example

With a conventional scrubber for performing gas bubbling in water on an inert gas, silicon oxide contained in the inert gas was removed, and the removal rate was evaluated. The conditions of the used inert gas was the same as Example 1.

The result is shown in Table 1. As shown in Table 1, it was confirmed that the removal rate was 30% that was worsened in comparison with the result of Example 1.

TABLE 1

|  |  | SILICON OXIDE REMOVAL RATE | NOTES |
| --- | --- | --- | --- |
| EXAMPLE 1 | SCRUBBER | 40% | 25% SODIUM HYDROXIDE SOLUTION |
|  | EJECTOR | 95% | 25% SODIUM HYDROXIDE SOLUTION |
|  | STATIC MIXER | 95% | 25% SODIUM HYDROXIDE SOLUTION |
|  | NUSH PUMP | 95% | 25% SODIUM HYDROXIDE SOLUTION |

TABLE 1-continued

|  | SILICON OXIDE REMOVAL RATE | NOTES |
| --- | --- | --- |
| EJECTOR + STATIC MIXER | 100% | 25% SODIUM HYDROXIDE SOLUTION |
| COMPARATIVE EXAMPLE | 30% | WATER |

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A silicon oxide removal apparatus for removing silicon oxide contained in an inert gas discharged from a silicon single crystal manufacturing apparatus, the silicon oxide removal apparatus comprising:
a contact unit configured to bring the inert gas discharged from the silicon single crystal manufacturing apparatus into contact with a strongly alkaline solution, the contact unit being any one of an ejector, a static mixer, and a nash pump, or a combination thereof; and
a neutralizing unit configured to neutralize an alkaline material contained in the inert gas brought into contact with the strongly alkaline solution.

2. The silicon oxide removal apparatus according to claim 1, wherein the neutralizing unit is a water scrubber or an acid scrubber.

3. The silicon oxide removal apparatus according to claim 1, further comprising a mechanism for heating the strongly alkaline solution to be brought into contact with the inert gas discharged from the silicon single crystal manufacturing apparatus.

4. The silicon oxide removal apparatus according to claim 2, further comprising a mechanism for heating the strongly alkaline solution to be brought into contact with the inert gas discharged from the silicon single crystal manufacturing apparatus.

5. The silicon oxide removal apparatus according to claim 1, wherein the strongly alkaline solution is a sodium hydroxide solution.

6. The silicon oxide removal apparatus according to claim 2, wherein the strongly alkaline solution is a sodium hydroxide solution.

7. The silicon oxide removal apparatus according to claim 3, wherein the strongly alkaline solution is a sodium hydroxide solution.

8. The silicon oxide removal apparatus according to claim 4, wherein the strongly alkaline solution is a sodium hydroxide solution.

9. A facility for recycling an inert gas for use in a silicon single crystal manufacturing apparatus by collecting and purifying the inert gas discharged from the silicon single crystal manufacturing apparatus and supplying the purified inert gas to the silicon single crystal manufacturing apparatus, the facility comprising at least the silicon oxide removal apparatus according to claim 1 to remove silicon oxide contained in the discharged inert gas before the inert gas is purified.

10. A facility for recycling an inert gas for use in a silicon single crystal manufacturing apparatus by collecting and purifying the inert gas discharged from the silicon single crystal manufacturing apparatus and supplying the purified inert gas to the silicon single crystal manufacturing apparatus, the facility comprising at least the silicon oxide removal apparatus according to claim 8 to remove silicon oxide contained in the discharged inert gas before the inert gas is purified.

11. The silicon oxide removal apparatus according to claim 5, wherein the sodium hydroxide solution has a concentration of 10% to 50%.

12. The silicon oxide removal apparatus according to claim 1, wherein the strongly alkaline solution is selected from the group consisting of: a potassium hydroxide solution; a lithium hydroxide solution; a rubidium hydroxide solution; and a cesium hydroxide solution.

* * * * *